United States Patent [19]

Sugayama et al.

[11] Patent Number: 5,465,408
[45] Date of Patent: Nov. 7, 1995

[54] AGC CIRCUIT FOR OPERATING IN ACCORDANCE WITH THE NATURE OF THE INTERFERENCE SIGNAL AND METHOD FOR CONTROLLING THIS CIRCUIT

[75] Inventors: Sakae Sugayama, Moriguchi; Takao Asami, Atsugi; Kenji Kato, Tokyo; Akira Maeta, Tottori, all of Japan

[73] Assignees: Sanyo Electric Co., Ltd., Osaka; Nissan Motor Co., Ltd., Kanagawa; Clarion Co., Ltd., Tokyo; Tottori Sanyo Electric Co., Ltd., Tottori, all of Japan

[21] Appl. No.: 67,211

[22] Filed: May 26, 1993

[30] Foreign Application Priority Data

May 29, 1992 [JP] Japan ..................................... 4-137375

[51] Int. Cl.[6] .................................................... H04B 1/10
[52] U.S. Cl. .................................. 455/249.1; 455/245.1; 455/246.1; 455/254
[58] Field of Search ........................... 455/249.1, 250.1, 455/245.1, 245.2, 246.1, 247.1, 254, 251.1, 234.1, 234.2, 240.1, 232.1, 253.2

[56] References Cited

U.S. PATENT DOCUMENTS

| 4,455,681 | 6/1984 | Wile ................................. 455/246.1 X |
| 4,955,073 | 9/1990 | Sugayama ........................ 455/249.1 X |
| 4,955,077 | 9/1990 | Sugayama ............................. 455/197 |

Primary Examiner—Reinhard J. Eisenzopf
Assistant Examiner—Philip J. Sobutka
Attorney, Agent, or Firm—Spensley Horn Jubas & Lubitz

[57] ABSTRACT

A controller for AGC recognizes a signal level broader than an AGC control output from an AGC circuit and also recognizes a signal level (a desired station signal level) in a narrow-band by an output from an S-meter. No interference, or the occurrence of 2-signal interference or inter modulation interference can be detected from a change ratio of the desired station signal at the time of the alteration of attenuation values of these two signal levels and an RF signal. In consequence, a proper regulation of the RF signal attenuation value can be carried out in accordance with the presence or absence of the interference and the kind of interference, whereby the suitable receive of the signal can always be achieved.

6 Claims, 5 Drawing Sheets

5,465,408

AGC CIRCUIT FOR OPERATING IN ACCORDANCE WITH THE NATURE OF THE INTERFERENCE SIGNAL AND METHOD FOR CONTROLLING THIS CIRCUIT

BACKGROUND OF THE INVENTION (i) Field of the Invention

The present invention relates to a characteristic change of an AGC circuit in a radio receiver for receiving a broadcast wave such as FM.

(ii) Description of the Prior Art

Heretofore, a radio receiver has possessed an AGC circuit in order to adapt itself to the level change of a radio wave (an RF signal). FIG. 1 is a block diagram illustrating a constitutional example of a conventional FM radio receiver. The FM broadcast wave (the RF signal) sent from a broadcasting station is received by an antenna, and the received RF signal is then input to an antenna tuning circuit 2, in which a signal in a predetermined frequency range is selected. The output of the antenna tuning circuit 2 is input to an RF amplifier 3 and then amplified therein. In general, this RF modifier 3 comprises MOSFET. Next, this amplified RF signal is input to an RF tuning circuit 4, in which a signal having a predetermined frequency is selected. A tuning frequency in this RF tuning circuit is changable, and so the tuning frequency is changed to select a desired station. The output of the RF tuning circuit 4 is input to a mixer 5, and in this mixer 5, it is mixed with a signal of a local oscillation frequency from a local oscillator 6 to become a signal (an IF signal) having an intermediate frequency. It is to be noted that the signal from the local oscillator 6 depends upon the signal selected in the RF tuning circuit 4, and the frequency of the output from the mixer 5 is always constant (10.7 MHz) irrespective of the frequency of the desired station to be selected.

The thus obtained IF signal is input to an IF amplifier 8 via a filter 7 which allows the only signal having the highly selective constant frequency (10.7 MHz) to be passed therethrough. This filter usually comprises a ceramic filter, and it can remove most signals other than the signal of the desired station. Afterward, the output of this filter is amplified by the IF amplifier 8, and a predetermined frequency is selected by a filter 9 again. Detection is then carried out by a detecting circuit 10 to obtain an audio signal.

Such a radio receiver has an AGC loop in order to prevent excessively large signals from being input to circuits constituting the radio receiver such as the amplifiers 3, 8 and the mixer 5. That is, the output signal of the mixer 5 is detected by a detecting circuit 11 to monitor an output signal level of the mixer 5. This detection may be carried out for the input signal of the mixer 5. Next, this detecting circuit 11 feeds a signal regarding the detection result to an AGC circuit 12. When the level of the received signal is high, this AGC circuit 12 controls an attenuator 13 by the signal from the detecting circuit 11 to lower the level of the signal to be input to the RF amplifier 3 and simultaneously controls the RF amplifier 3 to lower the output level of the RF amplifier 3. This attenuator 13 usually comprises a pin diode, and the value of a signal which flows to an earth side is controlled by the pin diode to lower the level of the input signal of the RF amplifier 3.

Furthermore, the RF amplifier 3 comprises a dual-gate MOSFET, and the RF signal is input through a first gate while the control signal from the AGC circuit 12 is input through a second gate to the RF amplifier 3. When the signal level is high, a bias voltage to be applied to the second gate of the FET is lowered to decrease an amplification ratio of the FET. As is apparent from the foregoing, the level of the signal to be input to the amplifier and the mixer is lowered in accordance with the level of the received signal, whereby the proper signal level can always be achieved.

Next, the output of the detecting circuit 10 is input to an output section 14, in which a voice corresponding to the input signal is output through a speaker or the like.

However, if the level of a radio wave from a station adjacent to the desired station is very high, two-signal interference occurs in the radio receiver having the above-mentioned AGC loop. That is, if a signal having the very high radio wave level is present in the vicinity of the desired station, the signal level of the output from the mixer 5 becomes high, and the RF signal is attenuated by means of the AGC circuit 12. As a result of such an attenuation, the signal of the desired station is also attenuated, so that the level of the obtained audio signal lowers inconveniently. Thus, it has been suggested that when the output level of the detecting circuit 10 is detected and it becomes apparent that the level of the desired station is low, the sensitivity (AGC sensitivity) of the AGC circuit 12 is lowered and a start point of the attenuation is retarded. Such a constitution permits elimination of the two-signal interference.

However, radio receiver interference also includes inter modulation (IM). For example, when there are two frequencies (f1, f2), a signal having a frequency of 2f2-f1 is produced. If the two frequencies f1, f2 are present at relatively near frequencies, a signal generated by the inter modulation has about the same frequency as in another broadcasting station in a certain case, so that inter modulation interference (IM interference) occurs. The signal generated by such an IM interference is output as the signal having the frequency of the desired station, and so it appears as the output of the detecting circuit 10. Therefore, if there is a control system for lowering the AGC sensitivity in the case that the output of the detecting circuit 10 is small as described above, the signal generated by such an IM interference is amplified and output.

In particular, the IM interference can be prevented by attenuating the RF signal, and therefore, owing to the operation retard of the AGC circuit as described above, the radio receiver more easily undergoes this IM interference. In the conventional radio receiver, the AGC sensitivity is regulated on the balance of the inhibition of this two-signal interference and the inhibition of the IM interference, but it is difficult to sufficiently inhibit both types of interference.

SUMMARY OF THE INVENTION

An object of the present invention is to provide an AGC circuit of a radio receiver capable of suitably inhibiting interference in accordance with the kind of interference and a method for controlling the AGC circuit.

A radio receiver regarding the present invention has an AGC circuit for operating in accordance with the kind of interference signal, and the AGC circuit comprises a mixing circuit for mixing an RF signal with a signal having a predetermined frequency to obtain intermediate frequency signals, a filter means for extracting a signal of a certain frequency from these intermediate frequency signals to obtain the signal of a desired station, a desired station signal level detecting means for detecting the level of the signal of the desired station which is the output of this filter means, an attenuating means for attenuating the RF signal to be input to the mixing circuit, a broad-band signal level detecting means for detecting the level of a broad-band signal prior to filtering by the filter means, and an attenuation value controlling means for controlling an attenuation value in the attenuating means on the basis of detected results of the desired station signal level detecting means and the broad-band signal level detecting means.

In this way, both of the desired station signal and the broad-band signal are detected. Therefore, the presence of the interference can be surely detected from the values of both the signal levels.

Furthermore, the attenuation value controlling means detects a change state of the level of the desired station signal at a time when an attenuation degree is changed by the attenuating means, and it also controls the attenuation value in the attenuating means in accordance with this change state.

Therefore, the two-signal interference and the inter modulation interference can be distinguished from each other. That is, in the case of the inter modulation interference, a ratio of the change of the desired signal level to that of the attenuation degree is higher than in the case of the two-signal interference. Therefore, it is possible to Judge the presence of the interference and the kind of interference, and therefore the control can be given in accordance with the nature of the interference. As a result, a suitable signal can be achieved by the proper inhibition of the interference.

Furthermore, the above-mentioned attenuation value controlling means increases the attenuation value, when the level change of the desired station signal is large at the time of the alteration of the attenuation degree.

This constitution permits the effective inhibition of the inter modulation interference.

In addition, the above-mentioned attenuation value controlling means contains an amplifier for the signal to be input to the broad-band signal level detecting means, and it changes an amplification degree in this amplifier to alter the level of the broad-band signal to be input to the attenuation value controlling means, thereby the attenuation value in the attenuating means is changed.

A plurality of the amplifiers are disposed, and any one of these amplifiers is selected to change the amplification degree.

Moreover, the present invention is directed to a method for controlling the operation of an AGC circuit in a radio receiver which comprises a mixing circuit for mixing an RF signal with a signal having a predetermined frequency to obtain intermediate frequency signals, a filter means for extracting a signal of a certain frequency from these intermediate frequency signals to obtain the signal of a desired station, a desired station signal level detecting means for detecting the level of the signal of the desired station which is the output of this filter means, an attenuating means for attenuating the RF signal to be input to the mixing circuit, and a broad-band signal level detecting means for detecting the level of a broad-band signal prior to filtering by the filter means, said method being characterized by comprising a step of changing an attenuation value by the attenuating means, a step of detecting a ratio of the change of the desired station signal level to that of the attenuation value, and a step of controlling the attenuating means so as to increase the attenuation value by the attenuating means in the case that the detected change ratio is about 1:3, or so as to decrease the attenuation value by the attenuating means in the case that the change ratio is about 1:1.

This constitution permits the control of the attenuation value in accordance with the kind of interference.

Another embodiment of the present invention further contains a step of judging whether or not the level of the desired signal is high in the case that the change ratio detected in the detecting step is 1:1, and when the level of the desired signal is high, the attenuation value is lowered to a relatively low value.

DETAILED DESCRIPTION OF THE INVENTION

Figure 1:
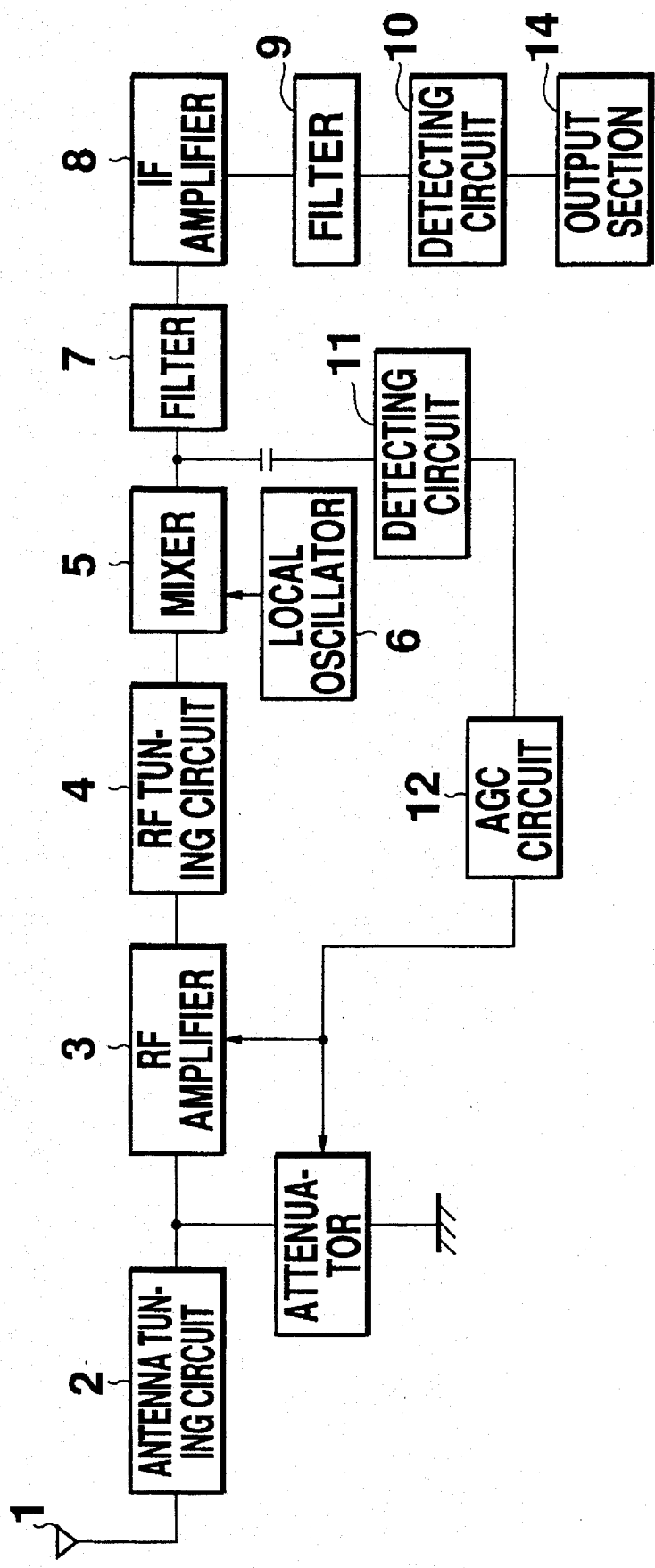
FIG. 1 is a block diagram illustrating the constitution of a conventional radio receiver.
Figure 2:
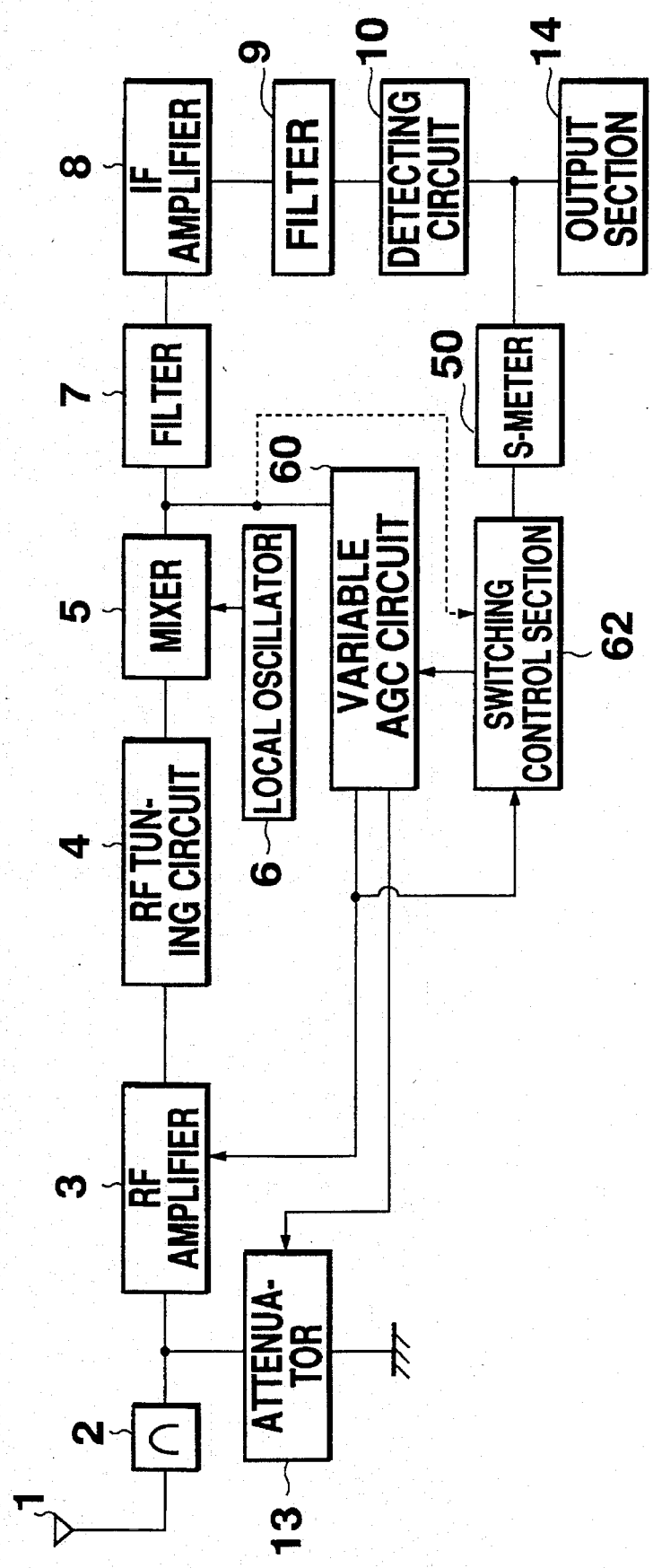
FIG. 2 is a block diagram illustrating the constitution of an embodiment.

Now, the present invention will be described in more detail in reference to one embodiment in accordance with drawings. FIG. 2 is a block diagram illustrating the overall constitution of the embodiment, and the same symbols as in FIG. 1 will be attached to the same members and the description of the same members will be omitted.

This embodiment has an S-meter (signal meter) 50, a variable AGC circuit 60 and a switching control section 62. The S-meter 50 detects the level of the output of a detecting circuit, i.e., the level of a desired signal. This kind of S-meter is what is employed in a conventional device.

The variable AGC circuit 60 controls attenuation on-off in an attenuator 13 and the drop in an amplification ratio, i.e., attenuation in an RF amplifier 3 in accordance with the level of a broad-band signal before passing through a filter 7 which is an output from a mixer 5. Furthermore, the variable AGC circuit 60 is constituted so as to change its sensitivity in accordance with a signal from the switching control section 62. Here, "changing the sensitivity" is substantially equal to "controlling an attenuation value in accordance with the level of the broad-band signal". That is, in this embodiment, when the sensitivity is heightened, the attenuator 13 is begun even at a relatively low level of an output from the mixer 5, and the start of the attenuation due to the decrease in amplification ratio in the RF amplifier 3 is hastened and the attenuation value increases.

To the switching control section 62, there are input a control signal regarding the attenuation value in the RF amplifier 3 which is the output of the variable AGC circuit 60 and the detecting signal of the S-meter 50. The control signal regarding the attenuation value in the RF amplifier 3 corresponds to the broad-band signal, and as shown by a dotted line in FIG. 2, the output signal from the mixer 5 may be directly input to the switching control section 62.

To the switching control section 62, the desired station signal which is the output of the S-meter 50 and the broad-band signal on the upstream of the filter 7 are input. The switching control section 62 judges the presence of the interference and its kind in accordance with the levels of the two signals. On the basis of this judgment, the switching control section 62 controls the variable AGC circuit 60, whereby the attenuation values in the RF amplifier 3 and the attenuator 13 are regulated.

Figure 3:
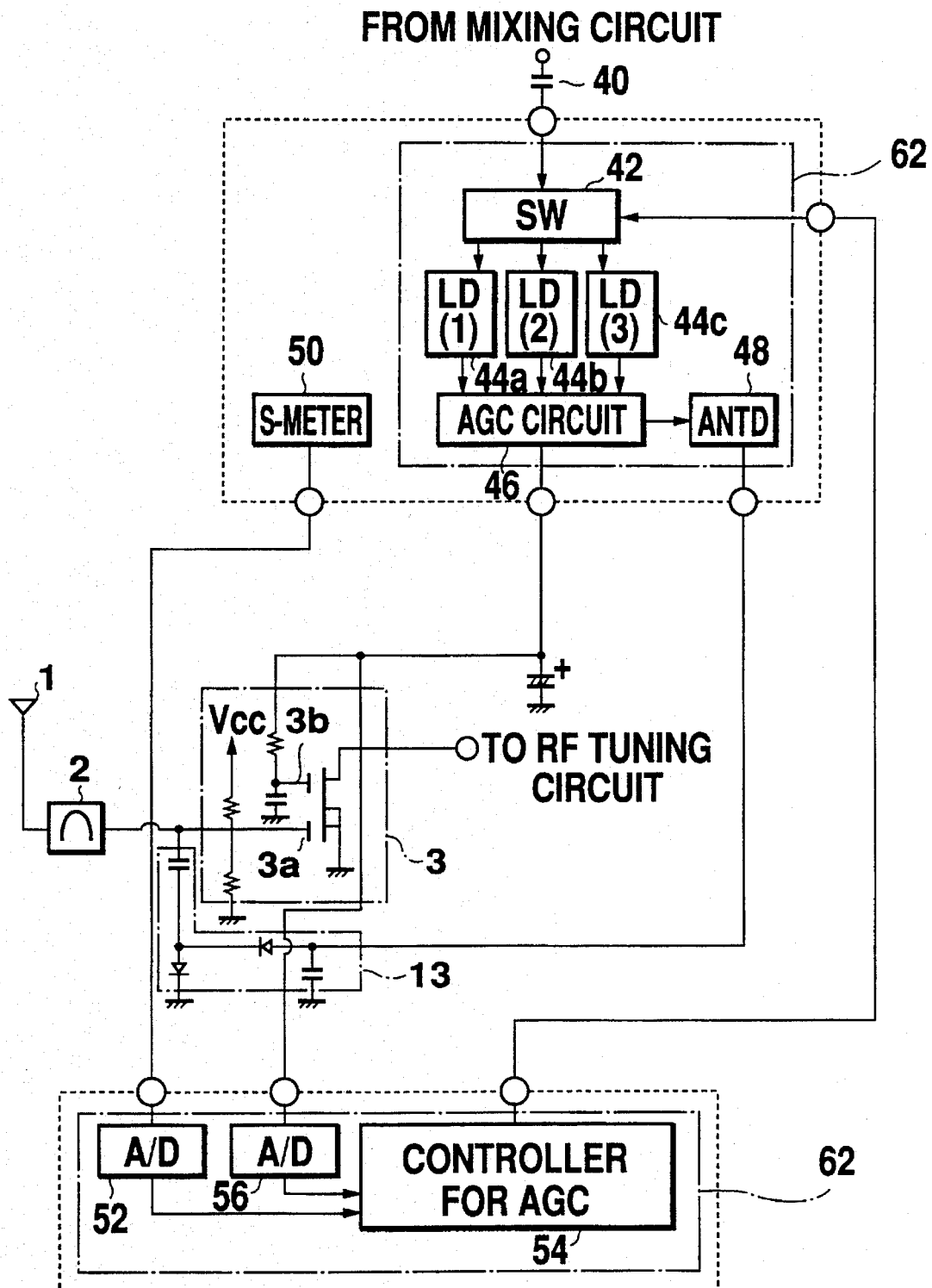
FIG. 3 is a block diagram illustrating the essential constitution of the embodiment.

FIG. 3 is a block diagram illustrating the essential section of a radio receiver regarding the present invention, and in this drawing, sections regarding an AGC operation are shown. A signal received by an antenna 1 is provided to an antenna tuning circuit 2, and in this circuit 2, a signal having a predetermined frequency is selected and then fed to the RF amplifier 3. On the input side of this RF amplifier 3, the attenuator 13 is provided. The RF amplifier 3 comprises an MOSFET, and the RF signal is input to a first gate 3a of the RF amplifier 3 and an amplification ratio control signal is input to a second gate 3b thereof. Signal levels on input and output sides of the RF amplifier 3 can be controlled by controlling a current to be fed to the attenuator 13 and a voltage to be applied to the second gate 3b of the RF amplifier 3.

In this embodiment, in order to carry out the AGC operation, an input or output signal of the mixing circuit 5 is input to a switch 42 via a capacitor 40. This switch 42 is a change-over switch for switching a route for outputting the input signal, and in this embodiment, the signal to be input is fed to any of three level detectors 44a, 44b and 44c.

These level detectors 44a, 44b and 44c are each provided with amplifiers having different amplification ratios, and they output a signal regarding a level detection result of the amplified signal. The output sides of these level detectors 44a, 44b and 44c are connected to an AGC circuit 46, and this AGC circuit 46 operates in accordance with the signal fed from any of the level detectors 44.

On the other hand, when the level of the signal input to the AGC circuit 46 reaches a predetermined first level, the AGC circuit 46 feeds a predetermined current to the attenuator 13 via an antenna dumping circuit 48 to release a part of the signal on the input side of the RF amplifier 3 through an earth, whereby the signal to be input to the RF amplifier 3 is reduced. Furthermore, in the case that the level of the input signal is higher than a second level, the AGC circuit 46 decreases the voltage to be input to the second gate 3b of the RF amplifier 3 and decreases the amplification ratio of the RF amplifier 3.

Accordingly, one detector is selected from the three level detectors 44a to 44c by the switch 42. Thus, even if the operation point of the AGC circuit 46 is kept constant, the sensitivity of AGC is changed by the switch 42. That is, when the amplification ratios of the level detector 44a, 44b and 44c are set to a low degree, a middle degree and a high degree, respectively, and when the level detector 44a is selected, the AGC sensitivity is lowest, and when the level detector 44c is selected, the AGC sensitivity is highest.

The level of a signal of the desired station after the wave detection is detected by the S-meter 50. The output of this S-meter 50 is fed to a controller 54 for AGC via an AD converter 52. Furthermore, the output signal of the AGC circuit 46 is fed to the AGC controller 54 via an AD converter 56. This controller 54 for AGC controls the switch 42.

In this embodiment, the switch 42, the level detectors 44a, 44b and 44c, the AGC circuit 46, the antenna dumping circuit 48 and the S-meter 50 constitute an AGC block, and the AD converters 52, 56 and the controller 54 for AGC constitute a controller block. These blocks are each composed of different integrated circuits. In FIG. 3, each block is surrounded with a dotted line, and each pin for external connection is represented by a symbol o.

Figure 4:
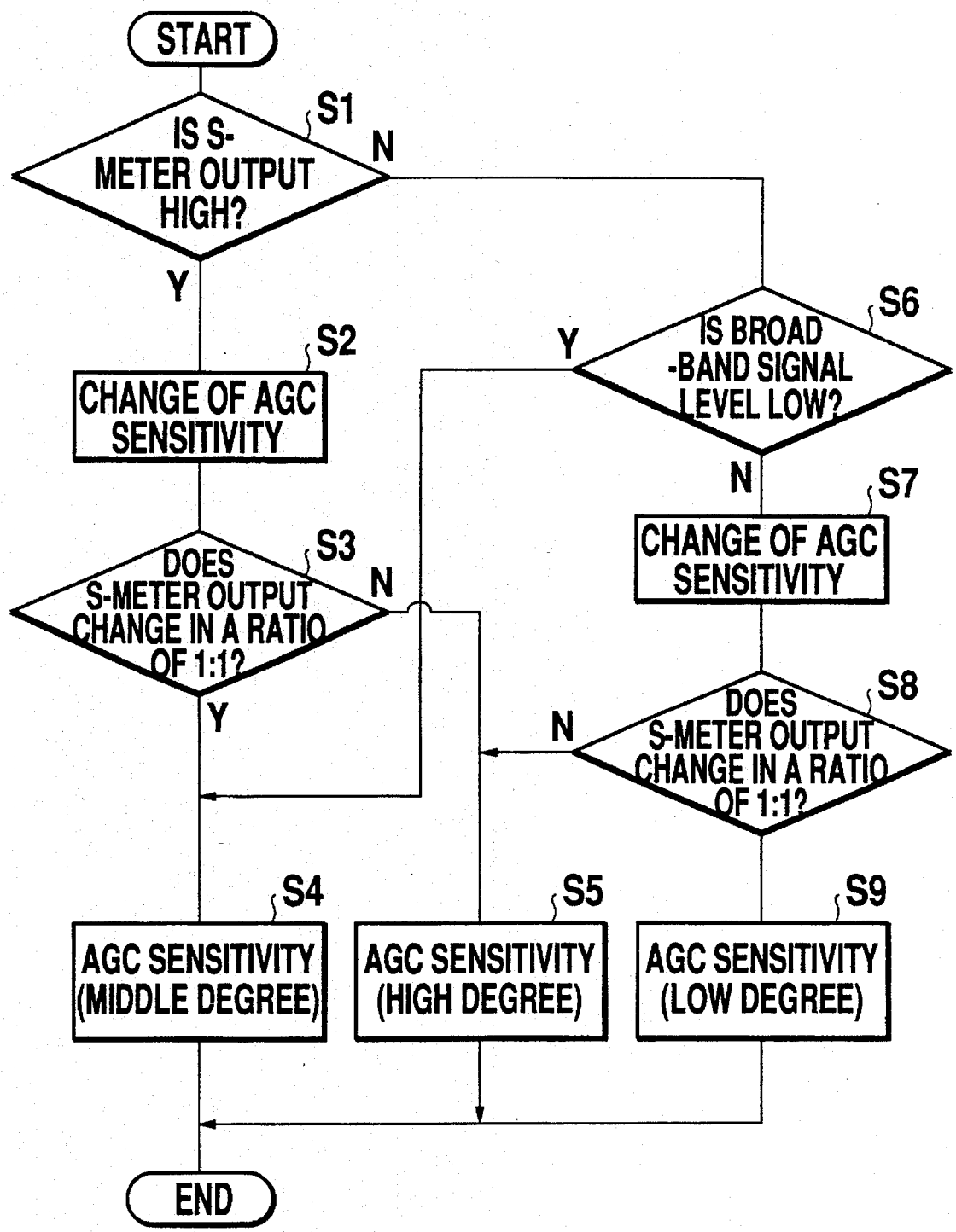
FIG. 4 is a flow chart illustrating the setting procedure of AGC sensitivity.

Here, the behavior of the controller 54 for AGC will be described in reference to FIG. 4. In the first place, the controller 54 for AGC forwards a signal to the switch 42 as initialization, and selects, for example, the level detector 44b, whereby the AGC sensitivity is set to the middle degree. In this condition, the controller 54 for AGC receives signals from the AD converters 52, 56 to recognize the information of the desired station level and the broad-band signal level. Moreover, the controller 54 judges from the two signals whether or not interference occurs and the kind of interference, if any. Thus, the controller 54 carries out the sensitivity switch of AGC, i.e., the selection of the level detector 44 on the basis of the above-mentioned judgment.

In this embodiment, it is first judged whether or not the output of the S-meter 50, i.e., the signal level of the desired station through the filter is high (S1). If the output of the S-meter 50 is high, the AGC sensitivity is then changed in a predetermined range (S2). This change is carried out as follows: the controller 54 for AGC sends the signal to the switch 42 to change the AGC sensitivity. That is, since the level detector 44b has been employed as the initialization, the level detector 44a or 44c is selected, whereby an attenuation value is changed in a predetermined range by the AGC circuit 46.

Figure 5:
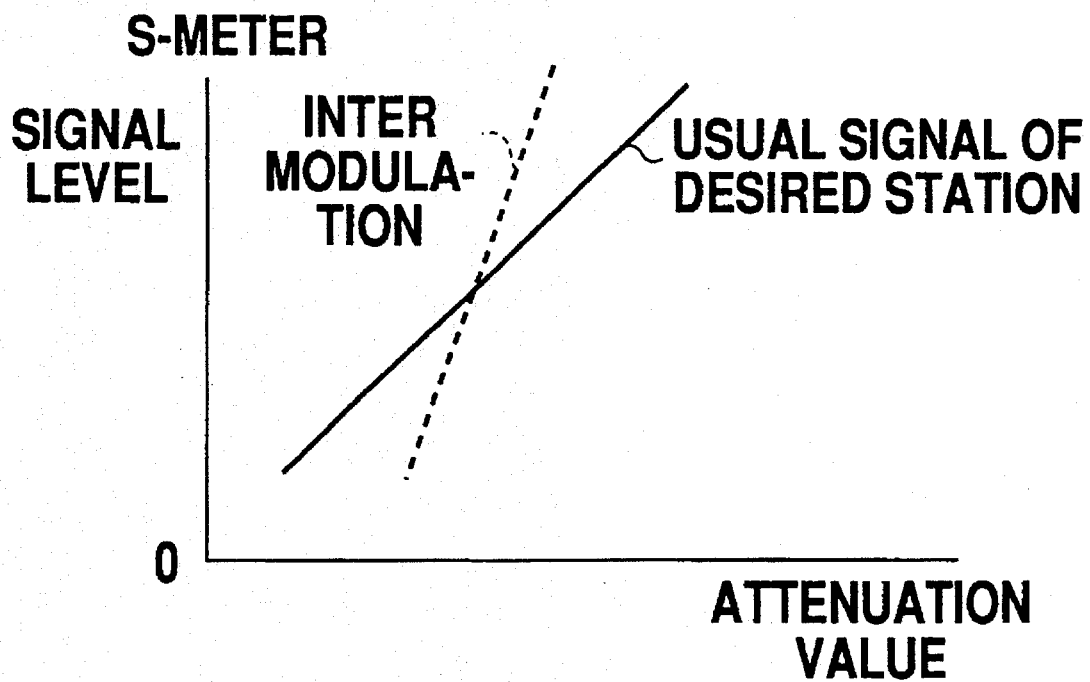
FIG. 5 is a characteristic diagram illustrating a relationship between an attenuation value for the judgment of IM interference and an output from an S-meter.

At this time, a variate of the output from the S-meter 50 is inspected. Here, in the case where the received signal is a signal of a desired station, when the attenuation value of the RF signal is changed, the output signal level of the S-meter 50 alters in a ratio of 1:1 as shown by a solid line in FIG. 5. However, when a signal produced by IM interference is input to the S-meter 50, the alteration takes place in a ratio of the attenuation value:the output of the S-meter= 1:3 as shown by a dotted line. Therefore, by inspecting the change of the output of the S-meter 5 to the attenuation value alteration of the RF signal by S2, it can be judged whether or not the IM interference is present.

Thus, it is judged whether or not the output of the S-meter 50 changes in a ratio of the change of the output of the S-meter 50:the change of the attenuation value= 1:1 (S3). If this change ratio is 1:1, the signal input to the S-meter 50 is not attributed to the inter modulation. Furthermore, the output of the S-meter 5 being large means that there is not any 2-signal interference attributed to a large signal level of an adjacent channel. Hence, it can be regarded that any interference does not occur, and the level detector 44b is selected by the switch 42, so that the AGC sensitivity is set to the middle degree (S4).

On the other hand, when the ratio of the output change of the S-meter 50 to the change of the attenuation value is not 1:1 but 1:3 in S3, it can be considered that the IM interference takes place. Thus, in order to inhibit the IM interference, the level detector 44c is selected by the switch 42, so that the AGC sensitivity is set to the high degree (S5), whereby the large attenuation value is set by the AGC circuit 46. Since the signal attributed to the inter modulation is attenuated three times as much as the attenuation value, it is possible to suppress the level of the input signal to the mixer 5 and prevent the IM interference from taking place.

On the other hand, if the output of the S-meter 50 is low in S1, it is judged whether or not the level of the broad-band signal fed from the AD converter 56 is low (S6). When the broad-band signal level is also low, the level of the signal itself of the desired station is judged to be low, and it is judged that the normal receive will be achieved. Thus, the operation transfers to S4, in which the AGC sensitivity is set to the middle degree.

Furthermore, if the broad-band signal is at a high level in S6 irrespective of the output of the S-meter 50 being low, it can be presumed that some interference occurs. Therefore, the AGC sensitivity is changed by the same procedure as in S2 and S3 to alter the attenuation value of the RF signal, thereby changing the output of the S-meter 50 (S7, S8). If a ratio of the change of the attenuation value to that of the output of the S-meter 50 is not 1:1, it is judged that the IM interference takes place, so that the operation transfers to S5 to set the AGC sensitivity to the high degree. On the other hand, if a ratio of the change of the attenuation value and that of the output of the S-meter 50 is 1:1, it is judged that the 2-signal interference attributed to the signal of an adjacent channel exists. Therefore, the level detector 44c is selected by the switch 42, so that the AGC sensitivity is set to the high degree, whereby the signal of the desired station can be protected from excessive attenuation.

In the above-mentioned embodiment, the three level detectors 44 are disposed, and for the sake of the sensitivity change for the IM interference detection in S2 and S7 and the final sensitivity setting in S4, S5 and S9, one sensitivity is utilized. However, for the sake of the sensitivity change for the IM interference detection and the sensitivity setting in the case that the IM interference or the 2-signal interference occurs, it is often preferable to utilize different sensitivities. Thus, it is recommended that the five level detectors 44 are disposed and the sensitivities of these detectors are differently set. Furthermore, the six or more level detectors 44 may be disposed, and the AGC sensitivities may be set so as to be suitably switched.

As described above, according to this embodiment of the present invention, the kind of interference can be judged, and the AGC sensitivity can be switched in accordance with the IM interference or the 2-signal interference, whereby a suitable receive of an FM radio wave can be achieved.

What is claimed is:

1. An AGC circuit for operating in accordance with a kind of interference signal which comprises a mixing circuit for mixing an RF signal with a signal having a predetermined frequency to obtain intermediate frequency signals, a filter means for extracting a signal of a certain frequency from these intermediate frequency signals to obtain the signal of a desired station, a desired station signal level detecting means for detecting the level of the signal of said desired station which is the output of said filter means, a broad-band signal level detecting means for detecting the level of a broad-band signal prior to filtering by said filter means, an attenuating means for attenuating the RF signal to be input to said mixing circuit, and an attenuation value controlling means for controlling an attenuation value in said attenuating means on the basis of detected results of said desired station signal level detecting means and said broad-band signal level detecting means, wherein said attenuation value controlling means contains an amplifier for amplifying the signal to be input to said broad-band signal level detecting means, and it changes an amplification degree in this amplifier to alter the level of the broad-band signal to be input to said attenuation value controlling means, thereby changing the attenuation value in said attenuating means.

2. The AGC circuit according to claim 1 wherein a plurality of said amplifiers are disposed, and any one of these amplifiers is selected to change the amplification degree.

3. The AGC circuit according to claim 1, wherein said broad-band signal level detecting means includes a plurality of level detectors for detecting a plurality of sensitivity levels, and an AGC signal generator for producing an AGC signal in response to an output signal of a respective level detector so as to provide the AGC signal to said attenuating means.

4. The AGC circuit according to claim 3, further comprising a sensitivity controlling means for controlling a detection sensitivity of said broad-band signal level detecting means on the basis of the output of the desired station signal level detecting means and the output of said broad-band signal level detecting means, wherein said sensitivity controlling means includes a control signal generator for generating a control signal in response to the output signal of the respective broad-band signal level detecting means, and a switch for selecting one of the level detectors.

5. The AGC circuit according to claim 1 wherein said attenuation value controlling means detects a change state of the level of the desired station signal at a time when an attenuation degree is changed by said attenuating means, and it controls the attenuation value in said attenuating means in accordance with this change state.

6. The AGC circuit according to claim 5 wherein said attenuation value controlling means increases the attenuation value, when the level change of the desired station signal is large at the time of the alteration of the attenuation degree.

* * * * *